United States Patent [19]

Gopinathan et al.

[11] Patent Number: 5,444,446
[45] Date of Patent: Aug. 22, 1995

[54] APPARATUS AND METHOD FOR DUPLICATING CURRENTS

[75] Inventors: Venugopal Gopinathan, Dallas, Tex.; Seema Varma, New York, N.Y.

[73] Assignee: Texas Instruments Incorporated, Dallas, Tex.

[21] Appl. No.: 87,822

[22] Filed: Jul. 1, 1993

[51] Int. Cl.⁶ .............................................. H03M 1/10
[52] U.S. Cl. .................................. 341/135; 323/315; 341/120
[58] Field of Search ................ 341/120, 133, 135; 323/315, 317

[56] References Cited

U.S. PATENT DOCUMENTS

| | | | |
|---|---|---|---|
| 4,989,02 | 1/1991 | Tan | 341/120 |
| 4,384,274 | 5/1983 | Mao | 341/135 |
| 4,573,005 | 2/1986 | van de Plassche | 323/315 |
| 4,689,607 | 8/1987 | Robinson | 341/135 |
| 4,967,140 | 10/1990 | Groeneveld et al. | 323/315 |
| 5,021,784 | 6/1991 | Groeneveld et al. | 341/120 |
| 5,155,385 | 10/1992 | Gotoh et al. | 307/296.8 |
| 5,223,743 | 6/1993 | Nakagawara | 307/296.1 |
| 5,283,582 | 2/1994 | Krenik | 341/158 |

OTHER PUBLICATIONS

"Current-Mode Algorithmic Analog-to-Digital Converters" by David G. Nairn & C. Andre T. Salama IEEE JSSC, vol. 25, No. 4, Aug. 1990.

"A Self-Calibration Technique for Monolithic High-Resolution D/A Converters" by D. W. J. Groeneveld, H. J. Schouwenaais, H. A. H. Termeer & C. A. A. Bastiaansen, IEEE JSSC, vol. 24 No. 6 Dec. 1989.

*Primary Examiner*—Marc S. Hoff
*Attorney, Agent, or Firm*—Mark A. Valetti; Douglas A. Sorensen; Richard L. Donaldson

[57] ABSTRACT

A current duplicator (10) is provided for receiving a calibration current and providing an output current to a load (10). Current duplicator (10) includes a transconductor (14) having a differentially coupled input with a parasitic capacitance for storing a differential voltage during a supply period. This parasitic capacitance also converts a difference current into the voltage during a feedback period. The difference current is equal to the difference between the output current and the calibration current. Transconductor (14) converts the voltage into the output current. The current duplicator also includes a first switch network for coupling the output current to the load (12) during the supply period. The output current remains within a predetermined amount from the calibration current during the supply period. A second switch network feeds back the difference current to the input during the feedback period at least until the output current becomes substantially equal to the calibration current.

20 Claims, 6 Drawing Sheets

APPARATUS AND METHOD FOR DUPLICATING CURRENTS

TECHNICAL FIELD OF THE INVENTION

The invention relates generally to the field of electronic circuits and more specifically relates to a device for duplicating current and its use within digital-to-analog converters.

BACKGROUND OF THE INVENTION

Current duplicators (also known as current copiers) are used in today's high accuracy digital-to-analog converters (DACs) to generate an output current from a reference current, i.e., calibration current, more accurately than conventional current mirror technology. The main component of a current duplicator, a transconductor having a transconductance, gm, can also be used as a component of a sample and hold circuit in high accuracy analog-to digital-converters (ADCs). (High accuracy DACs and ADCs are devices operating on data segments greater than 8 bits in size.)

A current duplicator receives a difference current, converts the difference current into a voltage, stores the voltage and converts the stored voltage into an output current which is supplied to a load during a supply time period. During a calibration time period, the duplicator is disconnected from the load and any of the stored voltage dissipated during the supply period is replenished with reference to the calibration current. That is, the current duplicator is calibrated. The ultimate goal is to have the output current supplied to the load during the supply period equal the calibration current. The closer the output current is to the calibration current, the more accurate the current duplicator is.

The calibration period of a current duplicator used in existing DACs is inversely proportional to its accuracy. That is, for an increase in accuracy, there is a decrease in speed (a longer calibration period is required), and an increase in speed forces a decrease in accuracy. Therefore, when selecting a high accuracy DAC using current duplicator technology, one is forced to compromise speed for accuracy and vice versa.

Likewise, the sampling period of a sample and hold circuit used in existing ADCs is inversely proportional to its accuracy.

SUMMARY OF THE INVENTION

One aspect of the present invention is a current duplicator for receiving a calibration current and providing an output current to a load. The current duplicator has a transconductor that converts a differential voltage into the output current. It has a differentially coupled input that is a means for enhancing accuracy. At this input is a parasitic capacitance for storing a differential voltage during a supply period. This parasitic capacitance also converts a difference current to a voltage during a feedback period. The difference current is equal to the difference between the output current and the calibration current. The current duplicator also has a first switch network for coupling the output current to the load during the supply period. A second switch network feeds back the difference current to the input during the feedback period at least until the output current becomes substantially equal to the calibration current.

A second aspect of the invention is a current duplicator that does not use a differentially coupled input. A buffer in the feedback path provides a means for increasing speed.

Technical advantages of the present invention are that it is accurate and operates at a high speed. Yet, its speed and accuracy are not interdependent.

DETAILED DESCRIPTION OF THE INVENTION

The preferred embodiment of the present invention and its advantages are best understood by referring to FIGS. 1–7 of the drawings, like numerals being used for like and corresponding parts of the various drawings.

Figure 1:
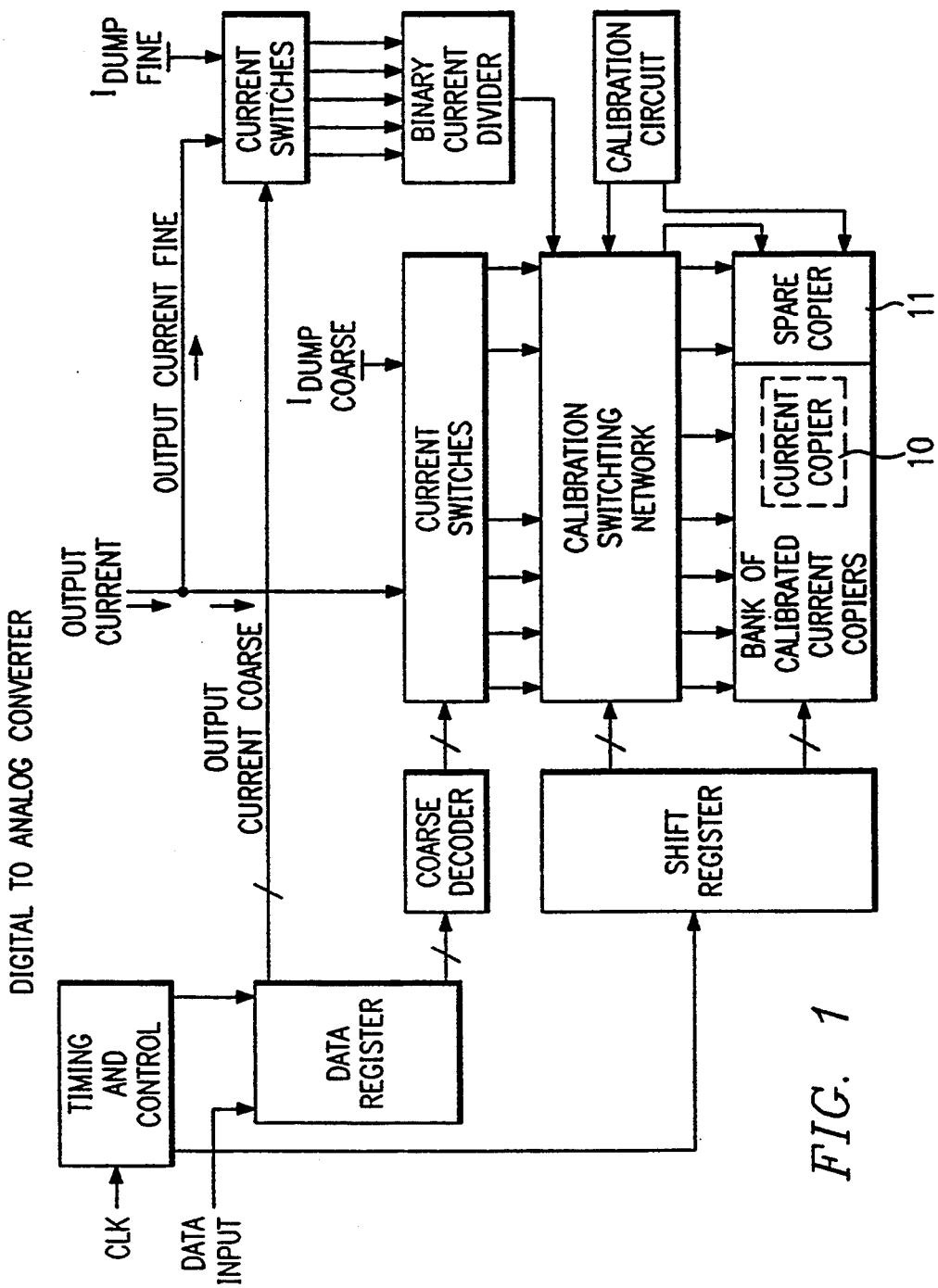
FIG. 1 shows a digital to analog converter using a bank of current duplicators.

FIG. 1 shows one embodiment of a DAC which incorporates a bank of identical calibrated current duplicators 10. A single current duplicator 10 is shown, for illustration purposes, as part of this bank. In a DAC, a plurality of these current duplicators 10 generate output currents which are selectively summed together to form a total output current to drive load 12. Each one of these current duplicators 10 is periodically calibrated by the same $I_{ref}$ source, thus ensuring that there are no errors introduced during calibration because of variations in current sources. A "spare" current duplicator 11 is always available to be switched into the circuit so that calibration is transparent to load 12. Thus, as in a version of musical chairs in which there is one less chair than there are players, one current duplicator 10 is always "waiting" to be "switched in", i.e. provide current, to load 12. (A current duplicator 10 does not provide an output current to load 12 while it is being calibrated.) While this "waiting" current duplicator 10 is disconnected from load 12, it is being calibrated, and "spare" duplicator 11 temporarily takes its place. It follows, therefore, that only one current duplicator 10 (or spare duplicator 11) is calibrated at any given time.

Figure 2:
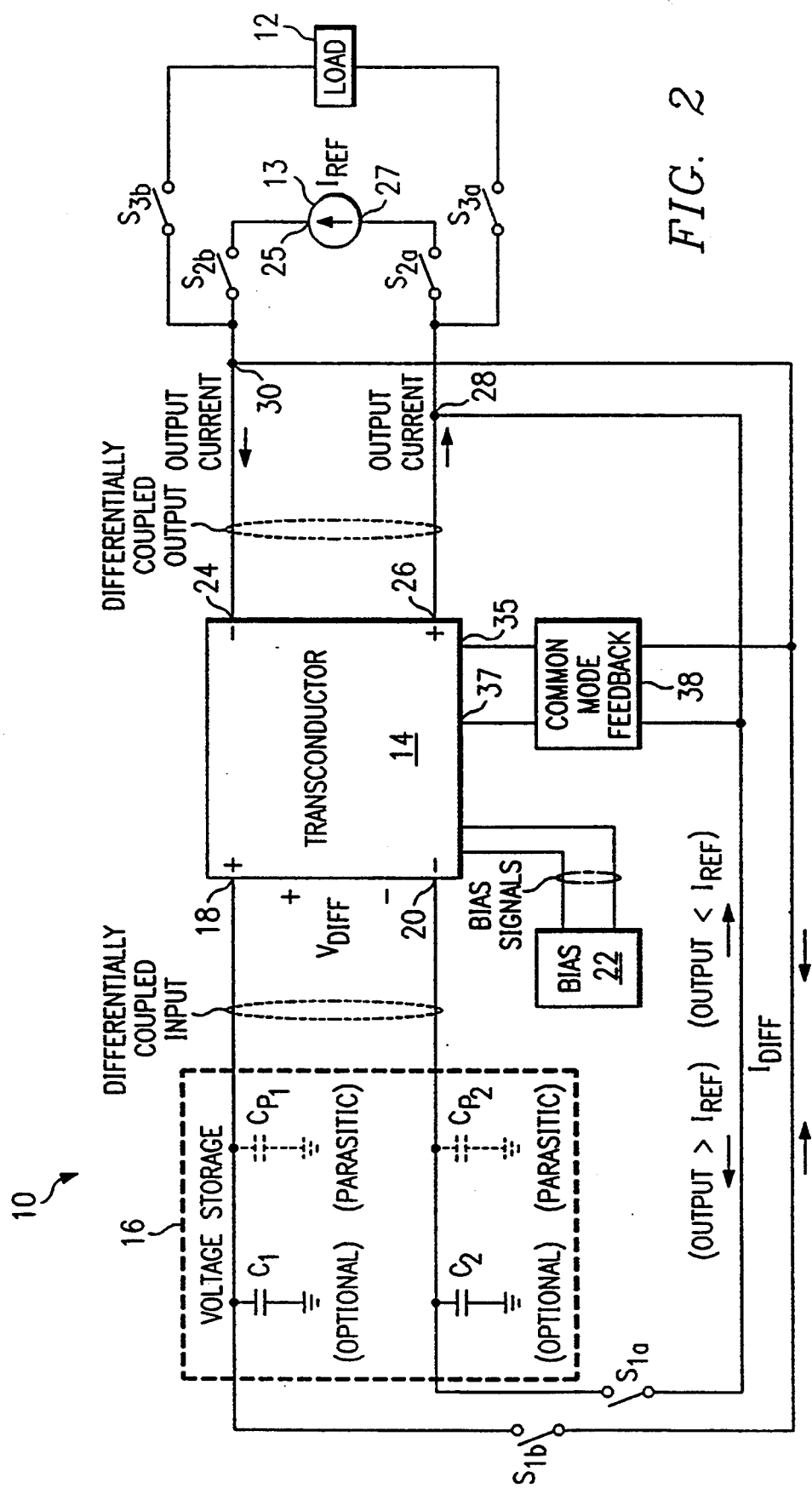
FIG. 2 is one embodiment of the current duplicator of FIG. 1.
Figure 3:
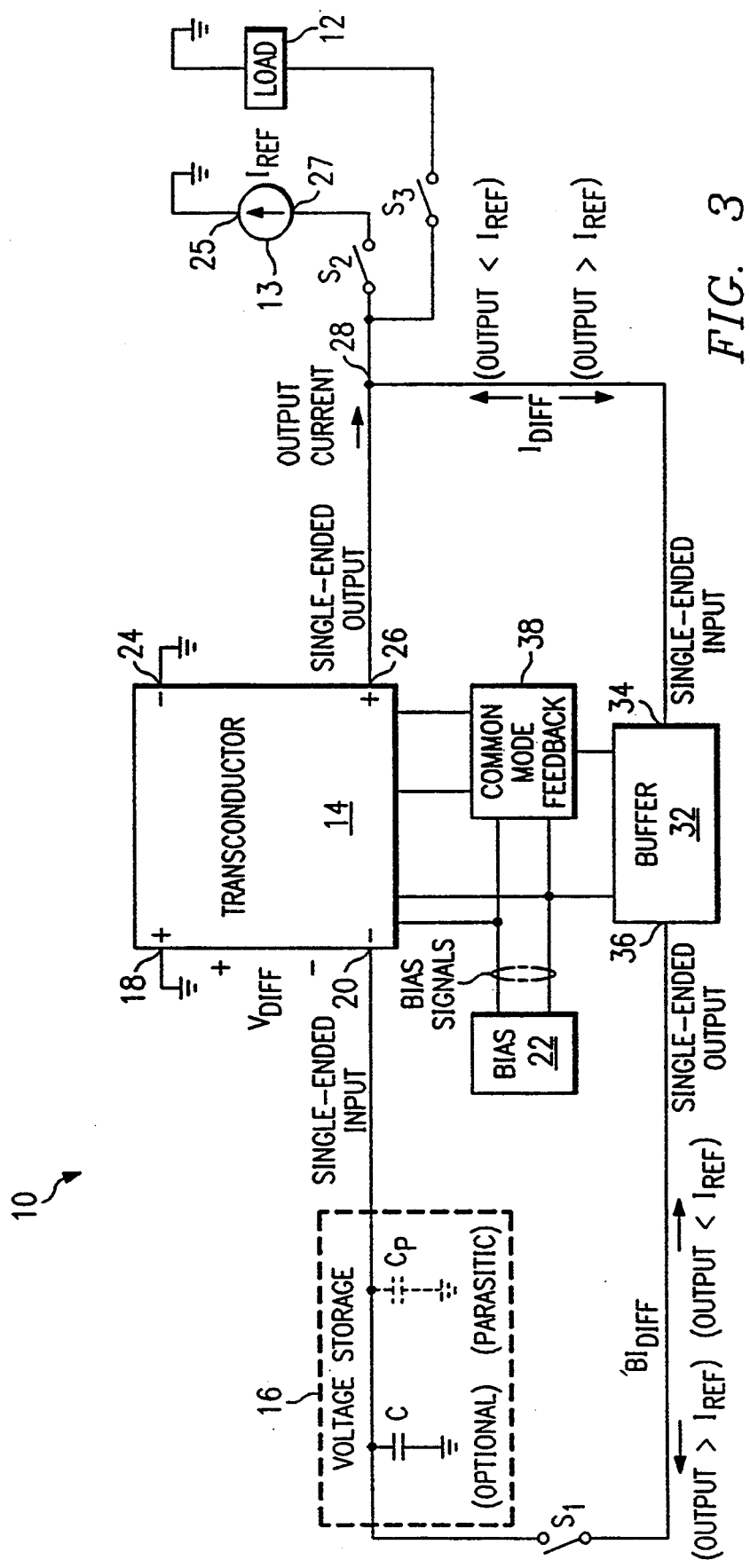
FIG. 3 is another embodiment of the current duplicator of FIG. 1.
Figure 4:
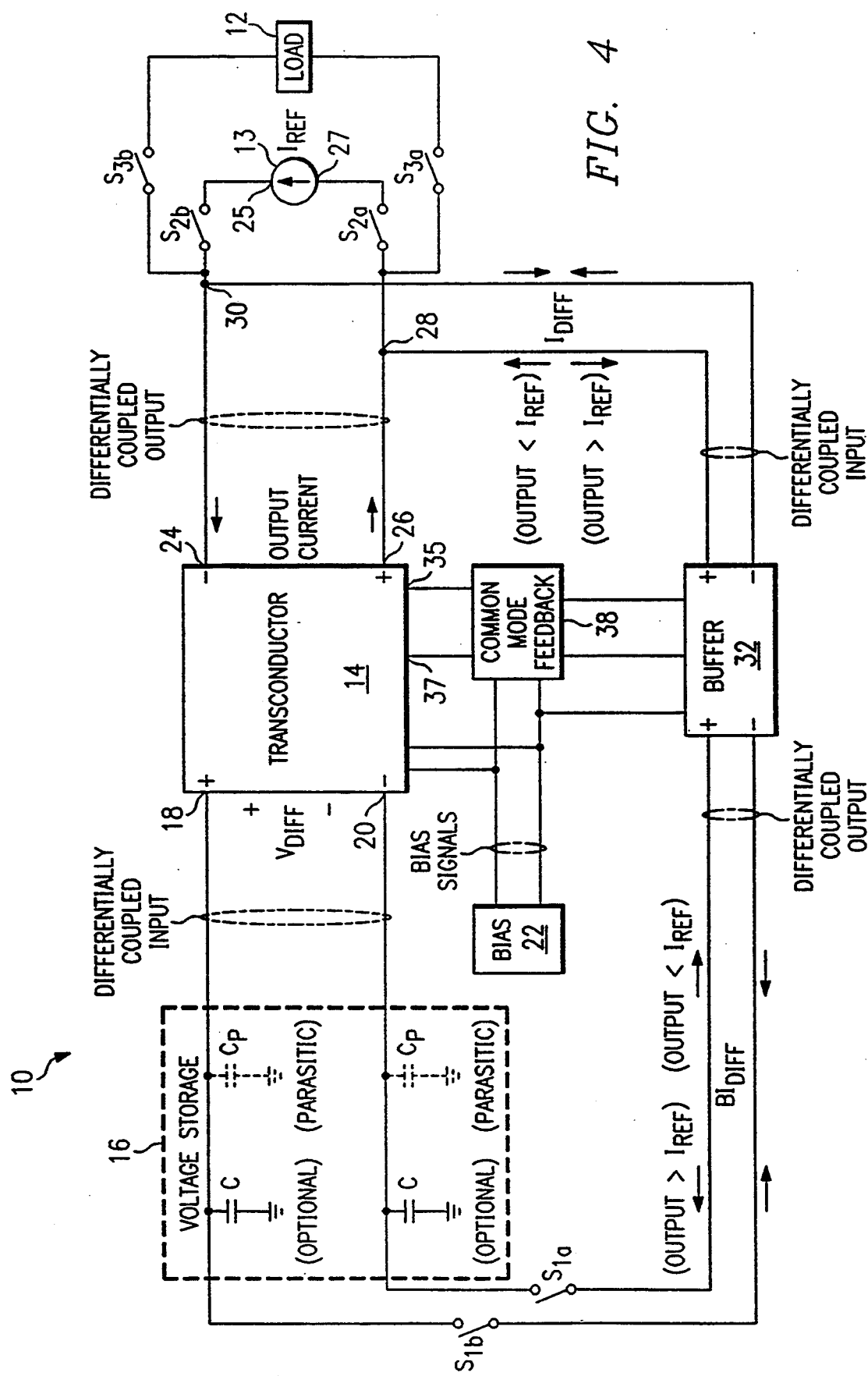
FIG. 4 is still another embodiment of the current duplicator of FIG. 1.

FIGS. 2–4 show different embodiments of a current duplicator 10. Generally, the purpose of current duplicator 10 is to provide an output current that is equal to a reference current, i.e., a calibration current, shown as $I_{ref}$ in FIGS. 2–4. During a calibration time period, the relative values of $I_{ref}$ and the output current result in a difference current labeled $I_{diff}$ in FIGS. 2–4. $I_{diff}$ is fed back, via a negative feedback loop, to the input of a transconductor 14 and is converted into and stored as a voltage $V_{diff}$ by a parasitic capacitance present at the inputs of transconductor 14. For illustration purposes only, this parasitic capacitance (and an optional capacitance to be described below) is represented by a voltage storage circuit 16 having at least one parasitic capacitor $C_p$.

Transconductor 14 is, in effect, a voltage-to-current converter which converts $V_{diff}$ into the output current. $I_{diff}$ adjusts $V_{diff}$, causing an adjustment in the amount of output current generated by transconductor 14. The negative feedback causes the output current to be adjusted until, theoretically, it equals $I_{ref}$. (The output current may not exactly equal $I_{ref}$ because of small errors introduced by circuit imperfections such as capacitor leakage.) When the output current becomes equal to $I_{ref}$, $I_{diff}$ becomes equal to 0 and $V_{diff}$ remains at its optimum value, i.e., the value which causes the output current to equal $I_{ref}$. At some point after this equilibrium is reached, $I_{ref}$ is disconnected from the circuit, thus breaking the feedback loop.

After the feedback loop is broken, transconductor 14 continues to generate an output current equal to $I_{ref}$. Due to the small amount of leakage and stray currents which are always present in voltage storage circuit 16 and transconductor 14, $V_{diff}$ begins to deviate from its optimum value. Thus, the output current begins to deviate from $I_{ref}$. This deviation typically becomes greater with the passage of time. A predetermined, maximum amount of deviation can be guaranteed by calibrating current duplicator 10 before the output current deviates from $I_{ref}$ by more than this predetermined deviation. Therefore, by adjusting the length of the supply period (the period during which current duplicator 10 supplies the output current to load 12), an output current within a guaranteed range can be generated by current duplicator 10. That is, generally, the more frequently current duplicator 10 is calibrated, the more accurately it generates the output current.

The voltage storage circuit 16, which, as stated above, comprises a capacitance, determines both the speed and the accuracy with which current duplicator 10 can be calibrated and generate the output current respectively. One means of increasing accuracy would be to increase this capacitance, so that any input errors, such as switching errors, are reduced. However, this increased capacitance takes longer to charge or discharge, thus reducing the calibration speed. Also, by decreasing this capacitance, the speed goes up but the accuracy goes down. Alternatively, the present invention allows both accuracy and speed to be increased without changing the capacitance. Therefore, an increase in speed will not require a decrease in accuracy, and an increase in accuracy will not require a decrease in speed.

FIG. 2 shows one embodiment of current duplicator 10 having increased accuracy for a given speed. ($I_{ref}$ generator 13 and load 12 are not part of current duplicator 10, but are shown for clarity.)

Current duplicator 10 includes transconductor 14 for converting a differential voltage $V_{diff}$ into a differential output current. Transconductor 14 has a positive input terminal 18, a negative input terminal 20, a negative output terminal 24, and a positive output terminal 26. Since none of these input or output terminals are connected to a common reference point, i.e. ground, both the input and the output of transconductor 14 are said to be differentially coupled. Voltage storage circuit 16 provides a differential voltage $V_{diff}$ between positive input terminal 18 and negative input terminal 20. Voltage storage circuit 16 includes Cp1 and Cp2, which are parasitic capacitors formed by transconductor 14 at its input terminals 18 and 20 respectively. As stated above, Cp1 and Cp2 are actually part of transconductor 14, but are shown as part of voltage storage circuit 16 for illustration purposes. Voltage storage circuit 16 may also include two optional capacitors C1 and C2 to form an optional capacitance. C1, if installed, is coupled between input 18 and ground. C2, if installed, is coupled between input 20 and ground.

A bias circuit 22 provides two bias signals to differential transconductor 14 for biasing the internal components of transconductor 14.

Two switch networks comprising six switches S, alternately couple the output terminals 24 and 26 of transconductor 14 between a feedback configuration and a supply configuration, both of which are discussed below. The first switch network comprises switches S3a and S3b. Switches S3a and S3b, when closed, couple terminals 24 and 26 to respective sides of load 12. The second switch network comprises switches S1a, S1b, S2a and S2b. Switches S1a and S1b, when closed, couple negative output terminal 24 and positive output terminal 26 to inputs 18 and 20 respectively. Switches S2a and S2b, when closed, couple output terminals 24 and 26 to terminals 25 and 27 respectively of $I_{ref}$ generator 13.

A common mode feedback circuit 38 is coupled between output terminals 24 and 26 and common mode feedback terminals 35 and 37 respectively. Common mode feedback circuit 38 provides stability to current duplicator 10 to prevent oscillations and control the settling time of the output current. Common mode feedback structures are known in the art and will not be discussed here in detail.

In operation, current duplicator 10 of FIG. 2 is either in one of two configurations during one of two respective time periods. Current duplicator 10 is in a feedback, i.e. calibration, configuration during a calibration period, and is in an output current supply configuration during a supply period. The position of switches S the switch networks determine which configuration current duplicator 10 is in at any given time.

During the supply period, switches S1a, S1b, S2a and S2b are open and switches S3a and S3b are closed. Thus, there is no feedback loop between output terminals 24 and 26 and input terminals 18 and 20. (The operation of current duplicator 10 will be discussed assuming that optional capacitors C1 and C2 are not installed, it being understood that the described operation would be virtually the same if C1 and C2 were installed.)

Transconductor 14 converts $V_{diff}$ into a differential output current at terminals 24 and 26, terminal 24 sinking the output current and terminal 26 sourcing the output current, as shown by the arrows in FIG. 2. Thus, the output current originates at positive output terminal 26, conducts through switch S3b to load through switch S3a and completes a path as it enters into negative output terminal 24. As time passes, $V_{diff}$ will deviate from its optimum value due to, among other causes, leakage of either or both Cp1 and Cp2. As $V_{diff}$ deviates, so will the output current deviate from being substantially equal to $I_{ref}$. At some predetermined time later (chosen to keep the deviation of the output current within a specified range) switches S3a and S3b will open and switches S1a, S1b, S2a and S2b will close. This signifies the beginning of the calibration period.

Generally, during the calibration period, a differential feedback current $I_{diff}$ is formed to force $V_{diff}$ back to its optimum value by imparting or depleting electrical charge from capacitors Cp1 and Cp2. Calibration will continue until $I_{diff}$ becomes substantially equal to 0, i.e., the output current becomes substantially equal to $I_{ref}$.

More specifically, during a first instance of calibration where the output current is greater than $I_{ref}$, the current going into summation node 28 from positive output terminal 26 is greater than the current, which is equal to $I_{ref}$, leaving node 28 through switch S2a. $I_{diff}$, which is equal to the output current minus $I_{ref}$, is fed back through switch S1a to negative input terminal 20. Negative input terminal 20 has a very high impedance, and therefore, draws negligible current. Therefore, virtually all of $I_{diff}$ flows into capacitor Cp2 causing the voltage across Cp2 to increase. Similarly, the output current flowing from summation node 30 into negative output terminal 24 is greater than $I_{ref}$, which is flowing into summation node 30 through switch S2a. $I_{diff}$, which is equal to the output current minus $I_{ref}$, flows into summation node 30 through switch S1a to complete the feedback loop. Positive input terminal 18 has a very high impedance, and, therefore, sources negligible current. Thus, $I_{diff}$ is sourced from capacitor Cp1 and the voltage across Cp1 falls.

As a result of the voltage across Cp1 decreasing and the voltage across Cp2 increasing, $V_{diff}$ becomes smaller. As $V_{diff}$ decreases, the output current decreases. This feedback process continues until the output current is equal to $I_{ref}$. When this equality occurs, $I_{diff}$ equals 0, no current flows out of Cp1 or into Cp2, $V_{diff}$ stabilizes to its optimum value, and the output current remains equal to $I_{ref}$.

In a second instance of calibration, the output current is less than $I_{ref}$. The output current coming from positive output terminal 26 is less than $I_{ref}$, the amount of current flowing from summation node 28 through switch S2a. $I_{diff}$, which equals $I_{ref}$ minus the output current, flows through switch S1a into summation node 28. $I_{diff}$ discharges Cp2, causing the voltage across Cp2 to decrease. Likewise, the output current from summation node 30 into negative output node 24 is less than the current flowing through switch S2b into summation node 30. $I_{diff}$, which equals $I_{ref}$ minus the output current, flows from summation node 30 into Cp1. Thus, the voltage across Cp1 increases. These voltage changes across Cp1 and Cp2 cause $V_{diff}$ to increase. As $V_{diff}$ increases, the output current also increases until the output current equals $I_{ref}$. When this equality occurs, $I_{diff}$ becomes equal to 0, $V_{diff}$ stabilizes to its optimum value, and the output current remains equal to $I_{ref}$.

Of course there is a third instance of calibration where the output current equals $I_{ref}$. This indicates that $V_{diff}$ is already at its optimum value. Because $I_{diff}$ equals zero, $V_{diff}$ will not be altered and will remain at its optimum value.

In either of the first two instances above, the minimum duration of the calibration period must be such as to allow $V_{diff}$ to reach its optimum value. Therefore, the speed of current duplicator 10 in its feedback configuration dictates the minimum duration of the calibration period.

At some time after the output current becomes equal to $I_{ref}$, switches S1a, S1b, S2a and S2b open and switches S3a and S3b close. This switching action returns current duplicator 10 to its supply configuration.

The differentially coupled input of transconductor 14 increases the output current producing accuracy of current duplicator 10 without reducing its calibration speed. Such a differentially coupled input makes current duplicator 10 immune from any common mode signals present on input terminals 18 and 20. For example, it is often the case that the switching action (the action of the switches opening or closing) of switches S1b and S1a will generate an error signal to Cp1 and Cp2 respectively, Since switches S1a and S1b are typically very similar, if not identical in structure, the error signal generated by S1a will be substantially equal to the error signal generated by S1b, i.e., these error signals will be common mode. Therefore, these error signals will be virtually rejected by the differentially coupled input of transconductor 14 because applying the same signal to both Cp1 and Cp2 does not change $V_{diff}$ at all. Switching action errors are, therefore, virtually eliminated with the differentially coupled input of transconductor 14. Therefore, by using the differentially coupled transconductor 14, accuracy of current duplicator 10 can be increased without reducing the calibration speed.

The addition of optional capacitors C1 and C2 to voltage storage circuit 16 further reduces switching action errors. This is because the larger the capacitance, the less of an effect an error current will have on the voltage stored by the capacitance. The tradeoff is that a larger capacitance reduces the speed at which current duplicator 10 can be calibrated, because it takes longer to charge or discharge a larger capacitance to produce the optimum value of $V_{diff}$.

FIG. 3 shows a second embodiment of current duplicator 10 able to operate at increased speed, in which transconductor 14 is in a single-ended, i.e. nondifferential, configuration. The input of transconductor 14 is coupled in a single-ended configuration because one input terminal, positive terminal 18, is coupled to ground. The output of transconductor 14 is coupled in a single-ended configuration since one of the output terminals, negative terminal 24, is coupled to ground. Current duplicator 10 includes a buffer 32 having an input 34 coupled to output terminal 26 and an output terminal 36 coupled to one side of S1. The other end of S1 is coupled to Cp2 and to negative input terminal 20. S3, when closed, couples load 12 to positive output terminal 26 and S2, when closed, couples $I_{ref}$ generator terminal 27 to positive output terminal 26. (Here, S3 is the first switch network while S1 and S2 are the second switch network.) Terminals 18, 24 (as stated above) and 25, as well as one end of load 12, are all coupled to ground. Additionally, common mode feedback circuit 38 is coupled between buffer 2 and transconductor 14 to provide stability to current duplicator 10. Bias circuit 22 provides bias signals to transconductor 14, common mode feedback 38 and buffer 32.

In operation, as was described above in conjunction with the embodiment of FIG. 2, $V_{diff}$ (which is no longer a truly differential voltage since it is referenced to ground) is adjusted by feeding back a feedback difference current during the calibration period until the output current equals $I_{ref}$. Output current is supplied to load 12 during the supply period.

During the supply period, S3 is closed and S1 and S2 are open so that the output current is supplied via switch S3 to load 12. $V_{diff}$ will typically deviate from its optimum value during the supply period due to such causes as leakage of Cp2 and bias currents from input terminal 20. The supply period lasts for a predetermined time which is chosen to keep $V_{diff}$ within a certain deviation from its optimum value, the optimum value being the value which causes the output current to equal $I_{ref}$. At the end of the supply period, S1 and S2 close and S3 opens to connect current duplicator 10 in a feedback configuration.

In the situation where the output current has become greater than $I_{ref}$, the current into summation node 28 from positive output terminal 26 is greater than $I_{ref}$, which is the current leaving node 28 through S2a. Therefore, $I_{diff}$, which is equal to the output current minus $I_{ref}$, flows from node 28 into terminal 34 of buffer 32. Buffer 32 acts as an impedance buffer, presenting a high impedance to positive output 26 in order that transconductor 14 not be loaded down with a low resistance which draws more current. Buffer 32 then produces a buffered difference current ($BI_{diff}$), proportional to $I_{diff}$, at output 36 and acts as a low impedance driver to drive $BI_{diff}$ through switch S1 to Cp. $BI_{diff}$ will charge Cp, thus decreasing $V_{diff}$. As $V_{diff}$ decreases, the output current from positive output terminal 26 decreases. $BI_{diff}$ continues to cause $V_{diff}$ to decrease until the output current equals $I_{ref}$.

When the output current from node 26 is less than $I_{ref}$, $I_{diff}$, which is equal to $I_{ref}$ minus the output current, flows from buffer terminal 34 into summation node 28. Buffer 32, as described above, generates $BI_{diff}$, which flows from Cp through S1 into terminal 36 of buffer 32, thus increasing $V_{diff}$. As $V_{diff}$ increases, the output current from positive output terminal 26 increases. This increase in the output current causes $I_{diff}$ to decrease until an equilibrium point is reached when the output current equals $I_{ref}$ and $V_{diff}$ stabilizes to its optimum value.

When the output current equals $I_{ref}$, $V_{diff}$ remains at its optimum value since both $I_{diff}$ and $BI_{diff}$ equal 0.

At the end of the calibration period, S1 and S2 open and S3 closes, thus returning current duplicator 10 to its supply configuration.

The addition of buffer 32 allows the feedback loop to adjust the output current to equal $I_{ref}$ much more quickly than if terminals 20 and 26 were directly coupled. This is because Cp, in conjunction with any internal output resistance (not shown) present at output terminal 26, will load down output terminal 26 and slow down the charging or discharging of Cp. By buffering output terminal 26 from Cp and input terminal 20, output 26 is not loaded down. Buffer 32 provides a low impedance point at terminal 36 so that Cp may be charged or discharged much more quickly than if buffer 32 were not present. Thus, the addition of buffer 32 increases the speed at which current duplicator 10 can be calibrated, without reducing the accuracy of current duplicator 10. Optional capacitor C can be added to increase the accuracy of current duplicator 10. However, as described above in conjunction with FIG. 2, the speed of current duplicator 10 will be reduced.

FIG. 4 shows yet another embodiment of current duplicator 10 which incorporates both a differentially coupled transconductor 14 for higher accuracy and a differentially coupled buffer 32 for increased calibration speed. The current duplicator 10 is structured similarly to current duplicator 10 of FIG. 2, with the addition of buffer 32.

Additionally, current duplicator 10 of FIG. 4 functions similarly to current duplicator 10 of FIG. 2. The main difference is that output terminals 24 and 26 are buffered from input terminals 18 and 20 (and Cp1 and Cp2) respectively by the buffer 32. $BI_{diff}$ is proportional to $I_{diff}$.

Figure 5:
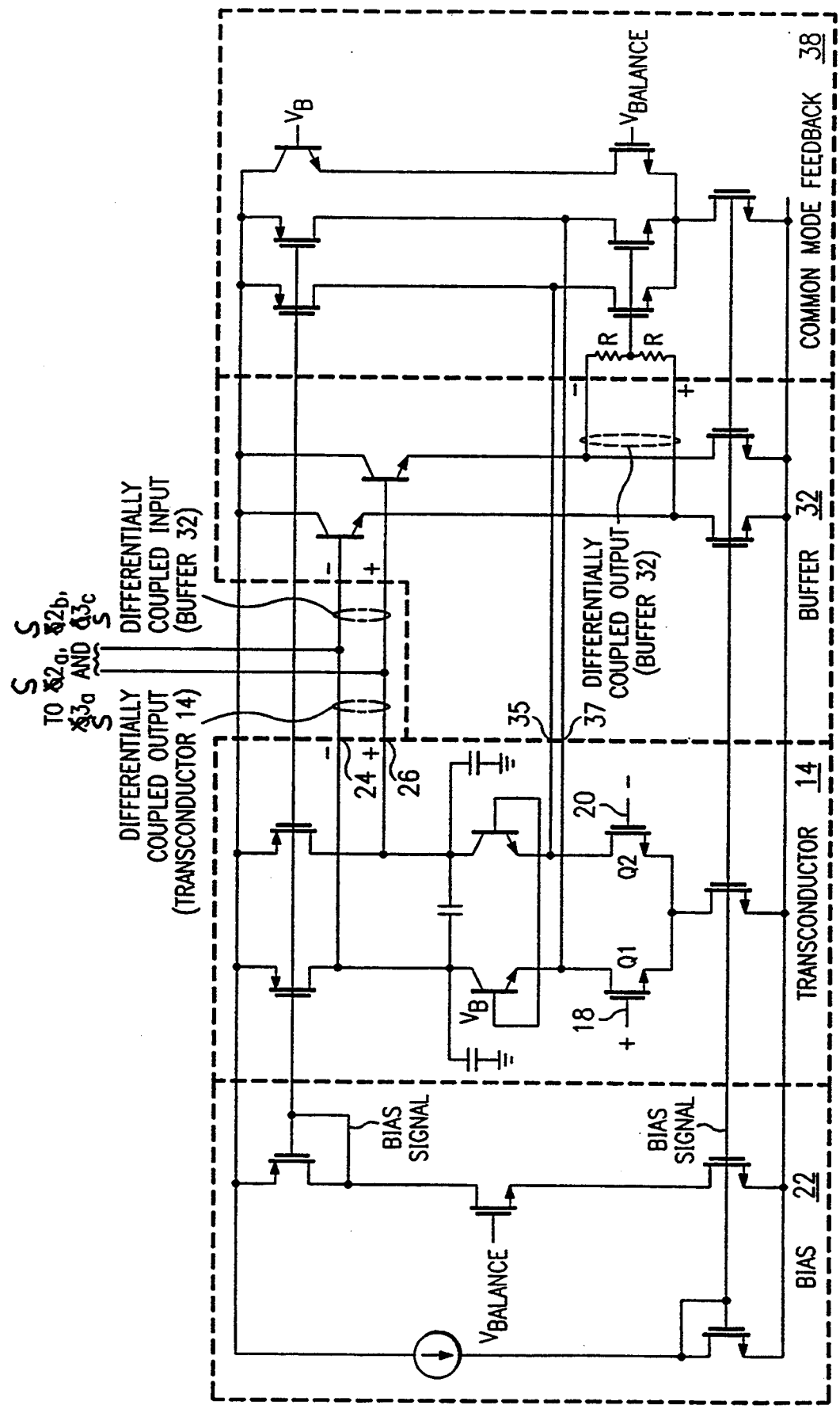
FIG. 5 is a detailed circuit implementation of the current duplicator of FIG. 4.

FIG. 5 is one embodiment of a detailed circuit implementation of the current duplicator 10 of FIG. 4, having transistors suitable for integrated circuit (IC) fabrication. For clarity, the switch networks (which are part of current duplicator 10), load 12, and current generator 13 (which are not part of current duplicator 10) are not shown. Although some transistors are shown as MOS type and others are shown as bipolar type, any of the transistors may be of either type. Transistors Q1 and Q2 are MOS type in this embodiment to provide a high input impedance for transconductor 14. Dashed boxes enclose the portions of circuitry which constitute bias circuit 22, differential transconductor 14, buffer 32 and common mode feedback circuit 38. VB is an internal bias voltage for biasing certain of the bipolar transistors, as shown. $V_{balance}$ is a balance voltage used to balance bias circuit 22 and common mode feedback circuit 38.

Figure 6:
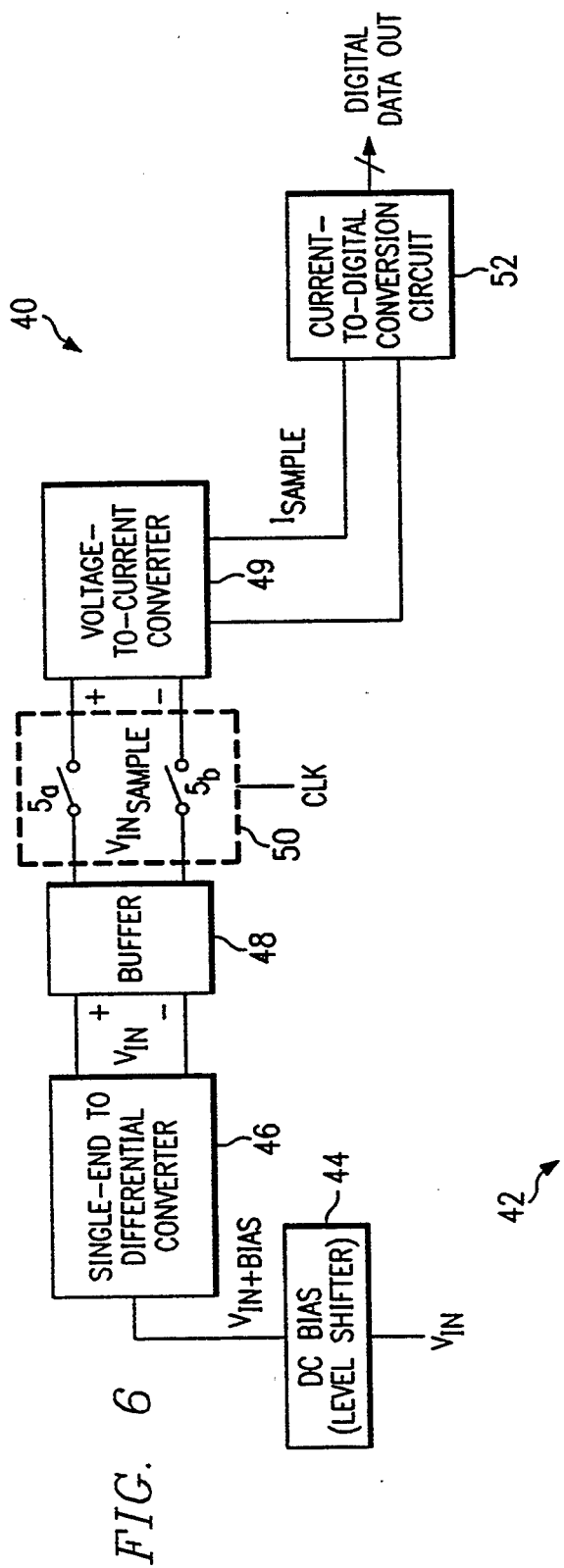
FIG. 6 is one embodiment of an ADC using a sample and hold circuit based on current duplicator technology.

FIG. 6 shows one embodiment of an analog-to-digital converter (ADC) 40 which utilizes a sample and hold 41 which is based on current duplicator technology. Sample and hold 41 includes a switch network 50 and voltage-to-current (V-to-I) converter 42. ADC 40 further includes a direct current (DC) bias circuit 44 for adding a DC bias voltage to an input voltage $V_{in}$ to form $V_{in'}$. Adding a DC bias allows for conversion of a $V_{in}$ which fluctuates above and below 0 volts. Single-end-to-differential converter 46 converts $V_{in'}$, which is single-ended, to a differential voltage $V_{sample}$. $V_{sample}$ is fed to buffer 48, which generates a buffered differential voltage $BV_{sample}$ which is output to differential switch network 50. Differential switch network 50 includes switches Sa and Sb. A clock signal is coupled to differential switch network 50 to control switches Sa and Sb. When switches Sa and Sb are closed, they couple $BV_{sample}$ to V-to-I converter 42, which converts $BV_{sample}$ to a differential current, $I_{sample}$. $I_{sample}$ is fed to a current-to-digital conversion circuit 52, which converts $I_{sample}$ into a digital data value comprising a predetermined number of bits.

In operation, $V_{in}$, the voltage to be converted into digital data, is fed to bias circuit 44, which imparts a DC bias, i.e., level, to $V_{in}$. This DC level is required to give ADC 40 the capability to convert voltages which are less than 0, as well as voltages which are greater than 0, within a specified maximum range. For example, if ADC 40 has a range of 20 volts, then adding a DC bias of 10 volts gives ADC 40 a range which extends between $+/-10$ volts.

Bias circuit 44 then outputs $V_{in'}$ to converter 46, which converts $V_{in'}$ from a single-ended voltage, i.e., a voltage referenced to ground, to a differential voltage $V_{sample}$. $V_{sample}$ is then buffered from switch network 50 by buffer 48, which generates buffered voltage $BV_{sample}$. This buffering increases the speed at which $V_{sample}$ can be sampled without decreasing the accuracy of sample and hold 41, as will be explained more fully below in conjunction with FIG. 7. $BV_{sample}$ is sampled at a rate which is determined by the frequency of the clock signal. During each cycle of the clock, switches Sa and Sb are closed for a predetermined time, called the sampling period, which is just long enough to impart the instantaneous value of $BV_{sample}$ to V-to-I converter 42. When switches Sa and Sb are opened, V-to-I converter 42 stores the instantaneous value of $BV_{sample}$ which was imparted to it while switches Sa and Sb were closed.

During the conversion period (the period during which switches Sa and Sb are open), V-to-I converter 42 converts the stored voltage into a current $I_{sample}$, which is proportional to the instantaneous value of $BV_{sample}$. $I_{sample}$ is then fed to conversion circuit 52, which converts $I_{sample}$ into a digital data signal. Bias circuit 44 (also known as a level shifter), single-end-to-differential converter 46, buffer 48 and current-to-digital conversion circuit 52 are known in the art, and their operation will not be described herein.

Figure 7:
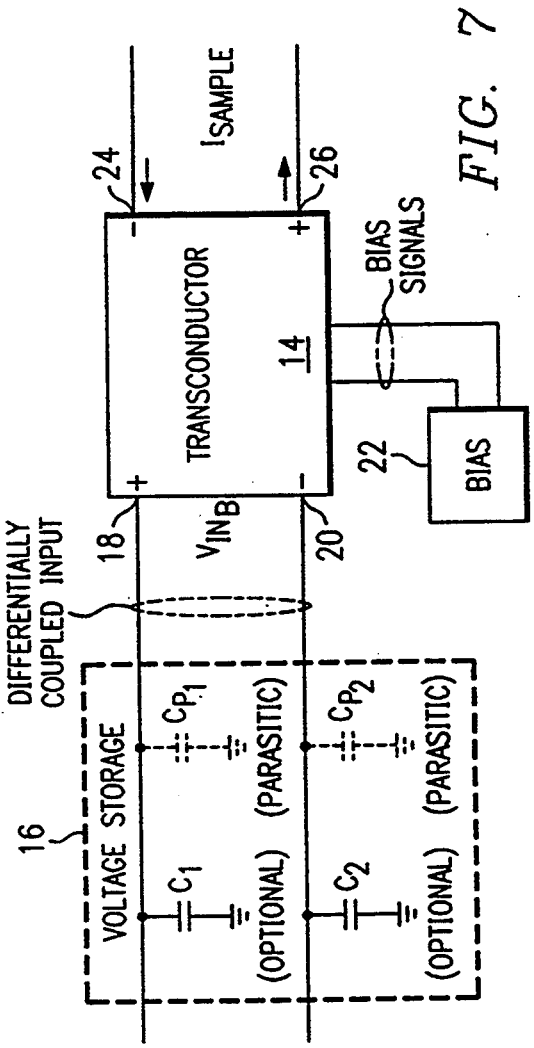
FIG. 7 is a block diagram of one embodiment of the voltage-to-current converter of FIG. 6.

FIG. 7 shows a more detailed diagram of V-to-I converter 42. V-to-I converter 42 includes differentially coupled transconductor 14 and voltage storage circuit 16 (shown for illustration purposes only), as well as bias circuit 22, in a similar configuration to that of FIGS. 2 and 4. However, converter 42 does not require any calibration circuitry such as buffer 32, any switches or any type of calibration current. As with the current duplicators of FIGS. 2 and 4, optional capacitors C1 and C2 may be included in voltage storage circuit 16 in order to increase the accuracy of the $I_{sample}$ production. However, the operation of V-to-I converter 42 will be described assuming that capacitors C1 and C2 are not installed. As before, this assumption will not change the operational analysis.

As described above in the description of FIG. 6, $BV_{sample}$ is imparted on Cp1 and Cp2 during the sampling period. During the conversion period, $BV_{sample}$ is stored by Cp1 and Cp2 and converted by transconductor 14 into differential current $I_{sample}$. As discussed above, the differentially coupled input of transconductor 14 blocks any common mode signals, such as common mode error signals generated by the switching action of switches Sa and Sb (FIG. 6). Therefore, $BV_{sample}$ is more accurately stored, and $I_{sample}$ is a more accurate representation of $V_{in}$. This increase in accuracy is attained without a reduction in sampling speed.

Although the present invention and its advantages have been described in detail, it should be understood that various changes, substitutions and alterations can be made herein without departing from the spirit and scope of the invention as defined by the appended claims.

What is claimed is:

1. A current duplicator for receiving a calibration current and providing an output current to a load, comprising:
   a transconductor for converting a differential voltage into an output current, said transconductor having a differentially coupled input with a parasitic capacitance for storing said differential voltage during a supply period and for converting a difference current into said differential voltage during a feedback period, said difference current equal to the difference between said output current and said calibration current;
   a first switch network for coupling said output current to said load during said supply period, and for decoupling said load during a calibration period; and
   a second switch network for feeding back said difference current to said differentially coupled input during said calibration period at least until said output current becomes substantially equal to said calibration current.

2. The current duplicator of claim 1 further comprising a bias circuit for generating a bias signal and providing said bias signal to said transconductor.

3. The current duplicator of claim 1 further comprising a common mode feedback circuit for stabilizing the current duplicator.

4. The current duplicator of claim 1 further comprising a buffer, having an input differentially coupled to said transconductor output and an output, for converting said difference current into a buffered difference current fed back to said input by said second switch network.

5. The current duplicator of claim 1 wherein said transconductor input comprises a differential pair of MOS transistors.

6. The current duplicator of claim 1 further comprising an optional capacitance, coupled in parallel with said parasitic capacitance, for converting said difference current into and storing said differential voltage.

7. A current duplicator for receiving a calibration current and providing an output current to a load, comprising:
   a buffer, having an input and an output, for converting a difference current into a buffered difference current, said difference current equal to the difference between the output current and the calibration current;
   a transconductor having an input with a parasitic capacitance for storing a differential voltage during a supply time period and for converting said buffered difference current into said voltage during a feedback time period, said transconductor for converting said voltage into the output current and providing the output current at an output; and
   a first set of switches for coupling the output current to the load during said supply time, the output current remaining within a predetermined deviation from the calibration current during said supply time; and
   a second set of switches for feeding back said buffered difference current to said input during said feedback period at least until the output current becomes substantially equal to the calibration current.

8. The current duplicator of claim 7 further comprising a common mode feedback circuit, coupled between said buffer and said transconductor, for stabilizing the current duplicator.

9. The current duplicator of claim 7 further comprising a bias circuit for providing a bias signal to said buffer and said transconductor.

10. The current duplicator of claim 7 wherein said transconductor output is differentially coupled to said buffer input.

11. The current duplicator of claim 7 wherein said transconductor input comprises a differential pair of MOS transistors.

12. A digital-to-analog converter comprising:
   a bank of current duplicators, each for providing an output current during a supply period, for providing a total output current to a load in response to a digital input signal;
   a spare duplicator for supplying an output current in place of a current duplicator during a calibration period of said current duplicator, each current duplicator and said spare duplicator comprising,
   a transconductor having a differentially coupled input with a parasitic capacitance for storing a voltage during a supply period and for converting a difference current into said voltage during a feedback period, said difference current equal to the difference between the output current and said calibration current, said transconductor for converting said voltage into the output current and providing the output current at an output,
   a first switch set for coupling the output current to the load during said supply period, the output current remaining within a predetermined amount from said calibration current during said supply period and a second switch set for feeding back said difference current to said input during said feedback period at least until the output current becomes substantially equal to a calibration current.

13. The digital-to-analog converter of claim 12 wherein each of the current duplicators and the spare duplicator further comprise a buffer for generating a buffered difference current in response to said difference current, said second switch set for feeding back said buffered difference current to said input during said feedback period.

14. The digital-to-analog converter of claim 12 further comprising a calibration circuit for generating said calibration current.

15. The digital-to-analog converter of claim 12 wherein each of said current duplicator and said spare duplicator further comprise an optional capacitance, coupled in parallel with said parasitic capacitance for converting said difference current into and storing said differential voltage.

16. A method for providing to a load an output current substantially equal to a reference current comprising the steps of:

generating a difference current equal to the difference between the output current and the reference current during a feedback period;

converting said difference current into a differential voltage until said difference current substantially equals zero;

storing said differential voltage during a supply period;

converting said differential voltage into the output current; and providing the output current to the load during said supply period, the output current remains substantially within a range from said reference current.

17. A method for providing to a load an output current substantially equal to a reference current comprising the steps of:

(a) generating a difference current equal to the difference between the output current and the reference current;

(b) generating a buffered difference current from said difference current;

(c) converting said buffered difference current into a voltage during a calibration period until the output current becomes substantially equal to the reference current;

(d) storing said voltage during a supply period;

(e) converting said voltage into the output current; and (f) providing the output current to the load during the supply period, the output current remains substantially within a range from the reference current.

18. The method of claim 17 wherein said Step (c) comprises the step of converting said buffered difference current into a differential voltage during a calibration period until the output current becomes substantially equal to the reference current;

wherein step (d) comprises the step of storing said differential voltage during said supply period; and wherein step (f) comprises the step of converting said differential voltage into the output current.

19. An analog-to-digital converter for converting a voltage into a digital data form, the analog-to-digital converter comprising:

a single-end-to-differential converter for converting the voltage to a differential voltage;

a sample and hold circuit for generating a differential sample voltage by sampling the differential voltage during a sample period and for holding the differential sample voltage and converting the differential sample voltage into a sample current during a conversion period, said sample and hold circuit comprising, a switch network for sampling said differential voltage, a transconductor having a differentially coupled input with a parasitic capacitance for receiving said differential voltage during said sampling period and storing said differential voltage during said conversion period, said transconductor for converting said differential voltage into said sample current.

20. The analog-to-digital converter of claim 19 wherein said sample and hold circuit further comprises a bias circuit for providing a bias signal to said transconductor.

* * * * *